US012647115B2

(12) United States Patent
Abusleme Hoffman et al.

(10) Patent No.: US 12,647,115 B2
(45) Date of Patent: Jun. 2, 2026

(54) BINARY INVERTER CIRCUITS WITH CONFIGURABLE THRESHOLD VOLTAGES

(71) Applicant: CIRRUS LOGIC INTERNATIONAL SEMICONDUCTOR LTD., Edinburgh (GB)

(72) Inventors: Angel C. Abusleme Hoffman, Round Rock, TX (US); Agustin R. Campeny, Austin, TX (US); John L. Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 18/440,796

(22) Filed: Feb. 13, 2024

(65) Prior Publication Data

US 2025/0260402 A1      Aug. 14, 2025

(51) Int. Cl.
H03K 17/08      (2006.01)
H03K 19/00      (2006.01)
(Continued)

(52) U.S. Cl.
CPC ...  H03K 19/0027 (2013.01); H03K 19/00384 (2013.01); H03K 19/01707 (2013.01); H03K 19/0948 (2013.01)

(58) Field of Classification Search
CPC ...... H03K 3/0377; H03K 3/13; H03K 3/2893; H03K 3/3565; H03K 17/08; H03K 17/081;
(Continued)

(56) References Cited

U.S. PATENT DOCUMENTS

| | | | |
|---|---|---|---|
| 5,898,625 A | 4/1999 | Manning | |
| 6,184,716 B1 | 2/2001 | Depetro et al. | |

(Continued)

FOREIGN PATENT DOCUMENTS

EP      2.782.251 A1      9/2014

OTHER PUBLICATIONS

Venezia, et al., "A 0.5-V 28-nm CMOS Inverter-Based Comparator with Threshold Voltage Control", 17th Conference on Ph.D Research in Microelectronics and Electronics (PRIME), Jun. 2022, Vilasimius, IT (pp. 1-4 in pdf).

(Continued)

*Primary Examiner* — Long Nguyen
(74) *Attorney, Agent, or Firm* — Andrew M. Harris; Mitch Harris, Atty at Law, LLC

(57)      ABSTRACT

Reduced delay and improved threshold tracking over PVT in a comparator input circuit and comparator are provided by circuits that include an inverter stage having a first complementary pair of transistors connected in a push-pull configuration. An input of the inverter stage is coupled to the gates of the first complementary pair of transistors, and an output of the inverter is coupled to the drains of the first complementary pair of transistors. The circuits also include one or more first degeneration transistors coupled between a source of one of the first complementary pair of transistors
(Continued)

and a power supply rail of the circuit, and a reference circuit with an output coupled to one or more gates of the first degeneration transistors. The reference circuit controls the one or more first degeneration transistors to cause the inverter stage to have a threshold voltage equal to a threshold control voltage.

20 Claims, 9 Drawing Sheets

(51) Int. Cl.

| | |
|---|---|
| *H03K 19/003* | (2006.01) |
| *H03K 19/017* | (2006.01) |
| *H03K 19/0948* | (2006.01) |

(58) Field of Classification Search
CPC ........... H03K 17/08104; H03K 17/082; H03K 17/0822; H03K 17/30; H03K 17/302; H03K 19/0021; H03K 19/0027; H03K 19/003; H03K 19/00315; H03K 19/00369; H03K 19/00384; H03K 19/01; H03K 19/017; H03K 19/01707; H03K 19/001721; H03K 19/02; H03K 19/08; H03K 19/094; H03K 19/0944; H03K 19/00948; H03K 19/20

See application file for complete search history.

(56) References Cited

U.S. PATENT DOCUMENTS

| | | | |
|---|---|---|---|
| 6,377,121 | B1 | 4/2002 | Giduturi |
| 9,025,403 | B1 | 5/2015 | Fredeman et al. |
| 2006/0001446 | A1 | 1/2006 | Pickering et al. |
| 2016/0056823 | A1* | 2/2016 | Ho ..................... H03K 19/0185 |
| | | | 326/41 |
| 2021/0305989 | A1* | 9/2021 | Han .......................... H03L 7/07 |

OTHER PUBLICATIONS

Sharroush, "Inverter-based voltage-controlled and programmable comparators", International Journal of Circuit Theory and Applications, Apr. 2020, vol. 48, Issue 7, Wiley & Sons., Hoboken, NJ (pp. 1-23 in pdf).

International Search Report in PCT Application PCT/US2025/013094 (pp. 1-13 in pdf.).

* cited by examiner

BINARY INVERTER CIRCUITS WITH CONFIGURABLE THRESHOLD VOLTAGES

BACKGROUND

1. Field of Disclosure

The field of representative embodiments of this disclosure relates to inverter circuits, and in particular to binary inverters having a configurable threshold voltage.

2. Background

Binary inverters, e.g., analog amplifiers with high gain in which the output is treated as a binary digital value, are used in many applications, including communications receivers and data converters, e.g., ADCs and DACs, as well as in other signal acquisition and comparison systems. In applications requiring a rapid throughput, the inherent delay of more complex analog comparators typically cannot be tolerated, and relatively simple inverter-based comparison circuits would be desirable for use as comparators. However, for N-type metal oxide semiconductor (NMOS) and P-type metal oxide semiconductor (PMOS) input stages, level-shifters are typically required to shift the voltage level of the output to be compatible with subsequent processing stages, and for complementary metal-oxide semiconductor (CMOS) input stages, the thresholds of the input stages are not well-defined, are dependent on the power supply voltage, and do not track variations in temperature and process well.

In order to overcome the drawbacks of the above-mentioned MOS comparator circuits, i.e., the process, voltage and temperature (PVT) variation, and in particular, to integrate the MOS input circuits in a Schmitt trigger/hysteresis comparator, which have dual trigger points, more complex schemes are employed using multiplexers to select proper thresholds to stabilize the hysteresis magnitude and position in the signal swing voltage range. The multiplexer circuits, however, are in the signal path, which increases the delay of the comparator circuits.

Therefore, it would be advantageous to provide an inverter input circuit and high-speed comparator that do not require complex schemes within the signal path that increase the delay of the comparator, while providing a threshold that does not overly vary with PVT.

SUMMARY

Reduced delay and improved threshold tracking over PVT in a comparator input circuit and comparator are provided in inverter circuits, comparators incorporating the input circuits, and their methods of operation.

The circuits include an inverter stage including a first complementary pair of transistors connected in a push-pull configuration. An input of the inverter stage is coupled to the gates of the first complementary pair of transistors, and an output of the inverter is coupled to the drains of the first complementary pair of transistors. The circuits also include one or more first degeneration transistors coupled between a source of one of the first complementary pair of transistors and a power supply rail of the circuit, and a reference circuit with an output coupled to one or more gates of the one or more first degeneration transistors. The reference circuit controls the one or more first degeneration transistors to cause the inverter stage to have a threshold voltage equal to a threshold control voltage.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses binary inverter/analog inverting amplifier comparison circuits, comparator circuits and integrated circuits that include the inverters, which provide reduced delay and improved threshold tracking over PVT. The circuits include an inverter stage including a first complementary pair of transistors connected in a push-pull configuration. An input of the inverter stage is coupled to the gates of the first complementary pair of transistors, and an output of the inverter is coupled to the drains of the first complementary pair of transistors. The input circuits also include one or more first degeneration transistors coupled between a source of one of the first complementary pair of transistors and a power supply rail of the circuit, and a reference circuit with an output coupled to one or more gates of the one or more first degeneration transistors. The reference circuit controls the one or more first degeneration transistors to cause the inverter stage to have a threshold voltage equal to a threshold control voltage.

Figure 1A:
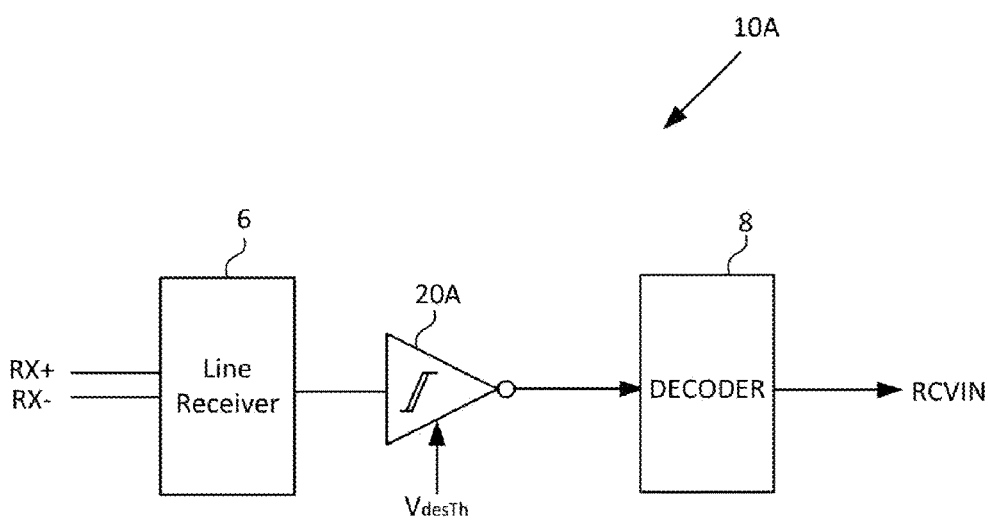
FIG. 1A is a block diagram illustrating an example system 10A, in accordance with an embodiment of the disclosure.

Referring now to FIG. 1A, a block diagram illustrating an example system 10A is shown, in accordance with an embodiment of the disclosure. System 10A implements a receiver portion of a physical-layer (PHY) part of a communications link. A line receiver 6 receives a signal from a differential pair of I/O connection signals RX+, RX−, and a comparator 20A evaluates an output of line receiver 6 according to internal threshold voltages to determine a binary value of the input signal represented by I/O connection signals RX+, RX−. The threshold voltages may be adjusted/configured according to a current state of the output of comparator 20A, so that comparator 20A provides a Schmitt trigger, i.e., comparator 20A may be a Schmitt comparator. The output of comparator 20A is provided to a decoder block 8 that interprets binary sequences of values represented by I/O connection signals RX+, RX− to generate a physical layer output signal RCVIN. The internal threshold voltages of comparator 20A may be controlled/configured by one or more input control signals VdesTh, e.g., two threshold voltages may be provided to adjust an upper and lower threshold used to implement hysteretic response of comparator 20A, or the upper and lower thresholds may have a fixed offset with respect to each other, while input control signal VdesTh adjusts their common-mode voltage. As will be described in more detail below, comparator 20A provides an internal threshold that is stable with process, power supply voltage and temperature (PVT), while introducing minimal delay.

Figure 1B:
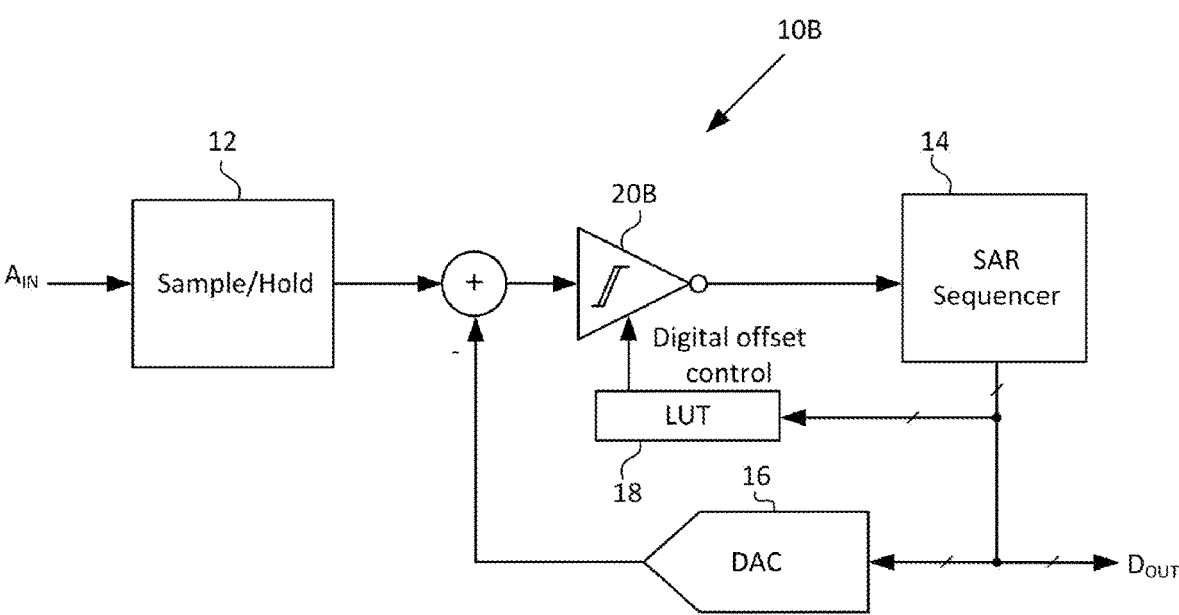
FIG. 1B is a block diagram illustrating an example system 10B, in accordance with another embodiment of the disclosure.

Referring now to FIG. 1B, a block diagram illustrating an example system 10B is shown, in accordance with an embodiment of the disclosure. Example system 10B implements a self-timed successive-approximation register (SAR) analog-to-digital converter (ADC) that converts an analog input signal $A_{IN}$ to a digital value DOUT. Analog input signal $A_{IN}$ is sampled and held by a sample/hold block 12 and, during an evaluation phase, converted to digital output Dour by a successive approximation process controlled by a SAR sequencer 14 that resolves digital output DOUT one bit at a time from a most-significant bit (MSB) to a least-significant bit (LSB). A digital-to-analog converter (DAC) 16 provides feedback of a present (approximated) value of digital output Dour provided from SAR sequencer 14, which is subtracted from the output of sample/hold block 12 by a combiner 13. A comparator 20B compares the output of DAC 16 to the difference between the output of sample/hold block 12 and the output of DAC 16, as provided by combiner 13. The evaluation phase terminates once the LSB is resolved, and another conversion cycle may begin. A look-up table (LUT) 18 provides one or more digital control signals based on the current value of the SAR in SAR sequencer 14, which allows for prevention of value-change voltage spikes that typically would occur when DAC 16 changes value by more than an LSB, by changing the offset of comparator 20B to prevent changes of state at the output of comparator 20B that may occur in response to a voltage spike. As will be described in more detail below, comparator 20B provides an internal threshold that is stable with process, power supply voltage and temperature (PVT), while introducing minimal delay, and, in some embodiments, enables varying the threshold voltage via direct digital control. In the illustrated example, comparator 20B is shown as a Schmitt comparator and may be exemplified by comparator circuit 20 of FIG. 2 as described below, but in alternative embodiments, comparator 20B may be a binary inverter/comparator with threshold control, as exemplified by inverters such as inverter 30A of FIGS. 3A, and the other exemplary inverters described below.

Figure 2A:
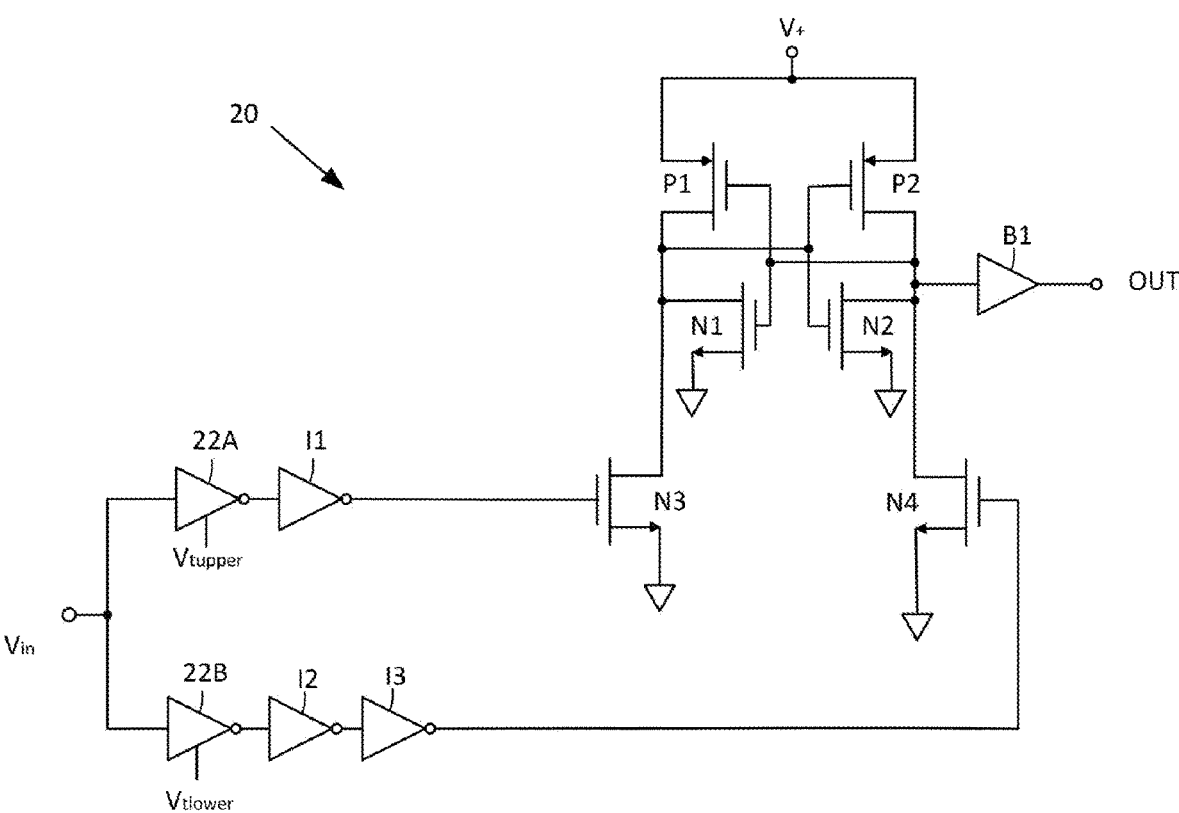
FIG. 2A is a simplified schematic diagram illustrating structure of, and FIG. 2B is a signal waveform diagram 25 illustrating operation of, an example comparator circuit 20 that may be used to implement comparator circuit 20A within system 10A of FIG. 1A and comparator 20B of FIG. 1B, in accordance with an embodiment of the disclosure.
Figure 2B:
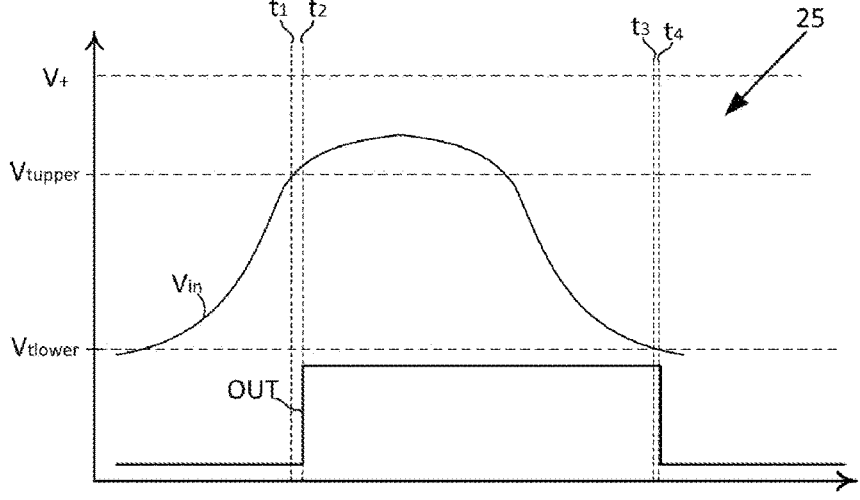

Referring now to FIG. 2A, a simplified schematic diagram illustrating a comparator circuit 20 that may be used to implement comparator circuit 20A within system 10A of FIG. 1A and comparator 20B of FIG. 1B is shown, in accordance with an embodiment of the disclosure. An input voltage $V_{IN}$ is evaluated by an inverter 22A, according to an internal threshold voltage that is controllable to set an upper threshold voltage by an upper threshold control voltage $V_{tupper}$ and is provided to a set input of a latch formed by a cross-coupled pair of PMOS transistors P1, P2 and NMOS transistors N1, N2, via a logical inverter I1. When input voltage $V_{IN}$ exceeds upper threshold control voltage $V_{tupper}$, the output of inverter 22A assumes a low voltage state, and the output of inverter I1 therefore assumes a high voltage state. Transistor N3 is thereby activated, causing the output Out of comparator circuit 20 to transition to the high-voltage state, since the gates of transistors P2 and N2 are pulled to the low-voltage state, causing transistor P2 to turn on and transistor N2 to turn off, which raises the input of buffer B1 to the high-voltage state. The output of the latch formed by transistors P1, P2 and transistors N1, N2 remains in the high-voltage state, independent of the state of transistor N3, until transistor N4 is activated, which will not occur until inverter 22B transitions to a high-voltage state, i.e., when input voltage $V_{IN}$ falls below a threshold voltage $V_{tlower}$. When inverter 22B transitions to the high-voltage state, inverters I2 and I3 form a buffer that provides a high-voltage state output signal to the gate of transistor N4, which pulls the gates of transistors N1 and P1 low, and causes the state of the latch formed by transistors P1, P2 and transistors N1, N2 to change, changing output signal OUT to the low-voltage state through buffer B1. Similar to the operation described above, which is illustrated by a signal waveform diagram 25 as shown in FIG. 2B, in which the above-described negative-going output transition is seen at a time $t_4$ after input voltage $V_{IN}$ falls below lower threshold voltage $V_{tlower}$ at a time $t_3$, for a positive transition of input voltage $V_{IN}$ crossing upper threshold voltage $V_{tupper}$ at a time $t_1$, the output of comparator circuit 20A transitions to a high-voltage state at time a time $t_2$. Comparator circuit 20A thus provides an inverting Schmitt comparator, since hysteresis is implemented by the presence of a different threshold voltage $V_{tlower}$ for negative transitions of the output signal, than a threshold voltage $V_{tupper}$ that is applied for positive transitions of the output signal. Various inverter circuits described in further detail below, which themselves may incorporate hysteresis, or not, and which therefore may not require the set-reset latch of comparator 20 to provide hysteresis, may be used as inverters 22A, 22B of comparator circuit 20, in accordance with different embodiments of the disclosure. The inverter circuits may include a reference circuit that is generally of identical design to the inverter circuit or a scaled design, and which incorporates one or more degeneration resistances, which may be provided by transistors. The transistors of the reference circuit may provide a bias voltage that may be adjustable or selectable to change the threshold voltage or may be selectively coupled to the inverter circuit. The use of an identical or scaled design stabilizes the fixed or adjustable/selectable degeneration resistance over process, power supply voltage, and temperature.

Figure 3A:
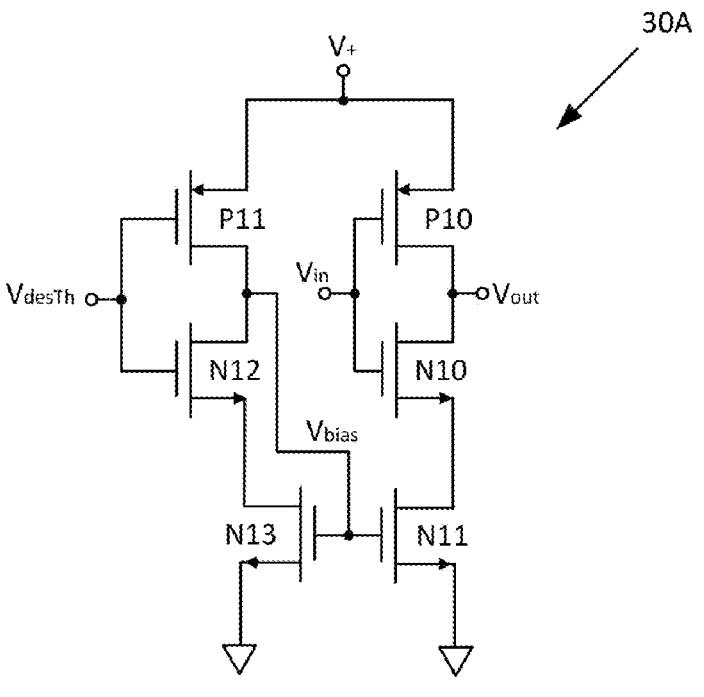
FIG. 3A is a schematic diagram of an example inverter 30A that may be used to implement inverters 22A and 22B in comparator 20 of FIG. 2A, in accordance with an embodiment of the disclosure.

Referring now to FIG. 3A, a schematic diagram of an example inverter 30A that may be used to implement inverters 22A and 22B in comparator 20 of FIG. 2A is shown, in accordance with an embodiment of the disclosure. Example inverter 30A inverts input signal $V_{in}$ to an output signal $V_{out}$ using a push-pull inverter pair formed by a transistor P10 and a transistor N10. The threshold voltage applied by transistors P10, N10 is adjusted by a degeneration resistance provided by a transistor N11. By varying a bias voltage $V_{bias}$ applied to the gate of transistor N11, the threshold voltage of example inverter 30A is made adjustable. Bias voltage $V_{bias}$ is generated by an example reference circuit that includes another push-pull pair formed by a transistor P11 and a transistor N12. The example reference circuit also includes another degeneration resistance, provided by a transistor N13. which has a gate also controlled by bias voltage $V_{bias}$, and an input to the push-pull pair formed by a transistor P11 and a transistor N12 is provided by a control voltage VdesTh, which sets the threshold voltage of example inverter 30A to a desired threshold voltage. Transistors P11, N12 and N13 of the reference circuit may be identical to corresponding transistors P10, N10 and N11, of the push-pull inverter circuit, so that the reference circuit and the inverter circuit track over PVT. Alternatively, transistors P11, N12 and N13 of the reference circuit may be scaled to corresponding transistors P10, N10 and N11 to provide the tracking behavior at a lower current level than that needed for the inverter circuit, to reduce power consumption. The reference circuit thus self-biases to a linear operating point set by control voltage VdesTh, which causes bias voltage $V_{bias}$ to stabilize at a voltage that will cause the push-pull inverter pair formed by a transistor P10 and a transistor N10 to have a threshold voltage equal to control voltage VdesTh. Because the reference circuit drives only a high-impedance node, i.e., the gate of the degeneration transistor(s), the bias voltage $V_{bias}$ is also immunized to load variations over PVT. Example inverter 30A is an example of an inverter circuit in accordance with an embodiment of the disclosure that does not include internal hysteresis, but that may be used in comparator circuit 20 of FIG. 2, to implement a Schmitt trigger/hysteresis comparator.

Figure 3B:
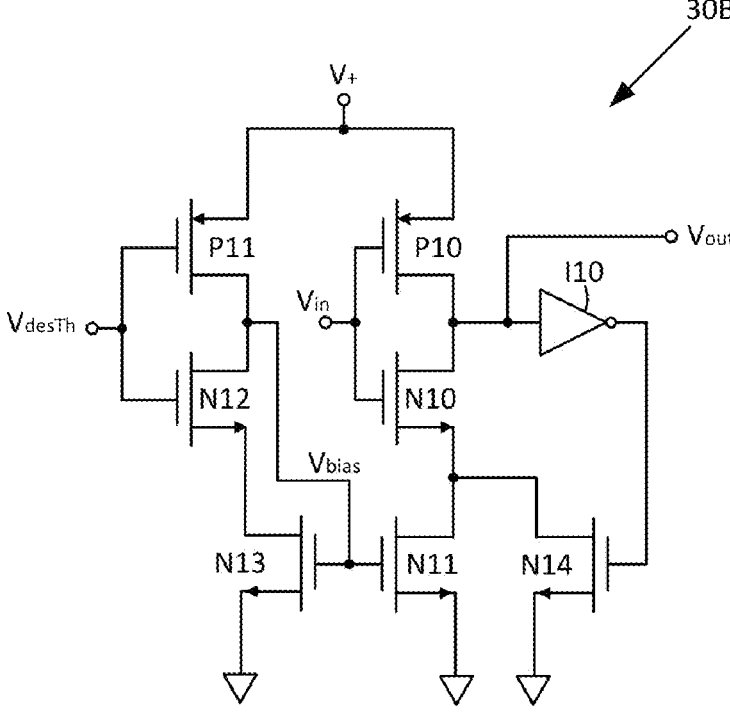
FIG. 3B is a schematic diagram of another example inverter 30B that may be used to implement inverters 22A and 22B in comparator 20 of FIG. 2A, in accordance with another embodiment of the disclosure.

Referring now to FIG. 3B, a schematic diagram of another example inverter 30B that may be used to implement inverters 22A and 22B in comparator 20 of FIG. 2A is shown, in accordance with another embodiment of the disclosure. Example inverter 30B includes internal hysteresis and is otherwise similar to example inverter 30A of FIG. 3A, so only differences between them are described below. Example inverter circuit 30B includes an inverter I10 that generates a signal complementary to output signal $V_{out}$, and an additional degeneration transistor N14. When input signal $V_{in}$ switches to or starts in a logical-high state, output signal $V_{out}$ assumes a logical-low state, and the output of inverter I10 is in a logical-high state, which activates transistor N14. Transistor N14 increases the degeneration provided at the source terminal of transistor N10, which lowers the threshold voltage of the push-pull inverter pair formed by transistor P10 and transistor N10, and consequently lowering the threshold voltage of inverter 30B, providing hysteresis, since input signal $V_{in}$ will have to fall to a lower voltage level to switch the state of the push-pull inverter pair formed by transistor P10 and transistor N10 than would otherwise be required if transistor N14 were absent or not active. The hysteresis may be made symmetric by scaling transistor N11 down to provide a higher degeneration resistance than transistor N13, or single-sided hysteresis may be desirable, e.g., when implementing one of the inverters in comparator 20, where the other one of the inverters is implemented with a PMOS degeneration device to provide high-side hysteresis.

Figure 3C:
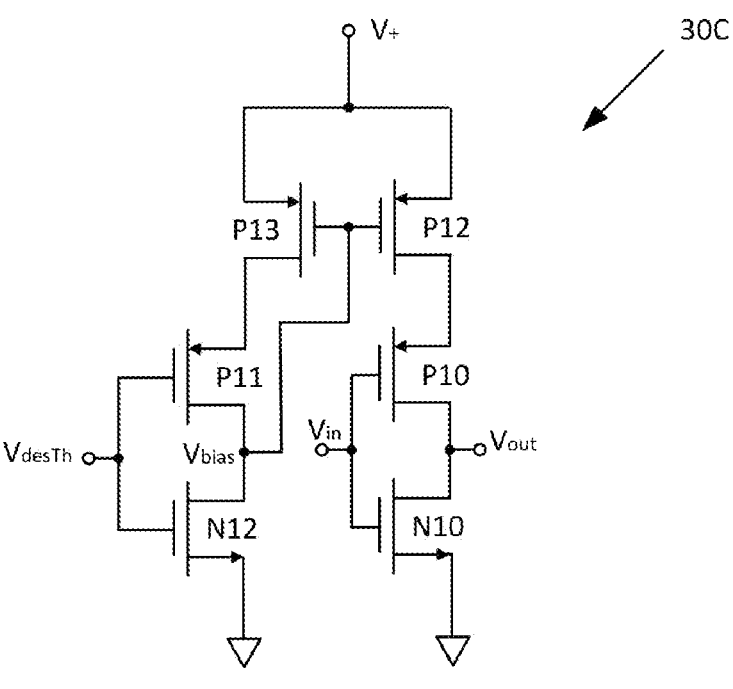
FIG. 3C is a schematic diagram of an example inverter 30C that may be used to implement inverters 22A and 22B in comparator 20 of FIG. 2A, in accordance with an embodiment of the disclosure.

Referring now to FIG. 3C, a schematic diagram of an example inverter 30C that may be used to implement inverters 22A and 22B in comparator 20 of FIG. 2A is shown, in accordance with an embodiment of the disclosure. Example inverter 30C provides an example of an inverter that includes degeneration using a PMOS transistor P12, and a corresponding degeneration transistor P13 in the reference circuit provided in combination with transistors P11 and P12. Example inverter 30C is otherwise similar to example inverter 30B of FIG. 3B, so only differences between them are described above.

Figure 3D:
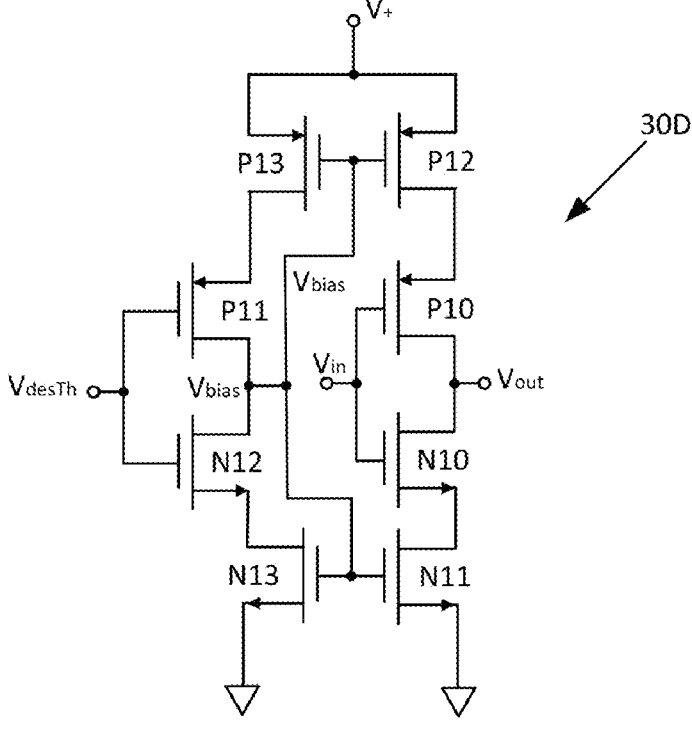
FIG. 3D is a schematic diagram of another example inverter 30D that may be used to implement inverters 22A and 22B in comparator 20 of FIG. 2A, in accordance with another embodiment of the disclosure.

Referring now to FIG. 3D, a schematic diagram of another example inverter 30D that may be used to implement inverters 22A and 22B in comparator 20 of FIG. 2A is shown, in accordance with another embodiment of the disclosure. Example inverter 30D provides an example of an inverter that includes degeneration using a CMOS architecture, with degeneration transistors P12, P13 added to example inverter 30A of FIG. 3A, and in which the reference circuit self-biases to cause bias voltage $V_{bias}$ to stabilize at a voltage that will cause the push-pull inverter pair formed by transistors P10, N10 to have a threshold voltage equal to control voltage VdesTh, and in which the degeneration provided to both the reference circuit and the push-pull inverter stage formed by transistors P10, N10 is split between a device (transistor P12) coupled to the positive power supply rail $V_+$ and a device (transistor N11) coupled to the negative/return power supply rail (ground). In general, the degeneration/threshold voltages provided by transistor P12 and transistor N11 would not be symmetrical for a given value of bias voltage $V_{bias}$, but the size ratios of transistor P12 and transistor N11 may be set for symmetry, or to other values, such as setting one threshold voltage near one of the power supply rails so that the particular transistor is fully-on, and using the transistor coupled to the opposite power supply rail to provide the adjustment of the inverter threshold voltage, which provides the simplest adjustment scheme and a fast output transition time. Example inverter 30D is otherwise similar to example inverter 30A of FIG. 3A and inverter 30C of FIG. 3C, so only differences between them are described above.

Figure 4:
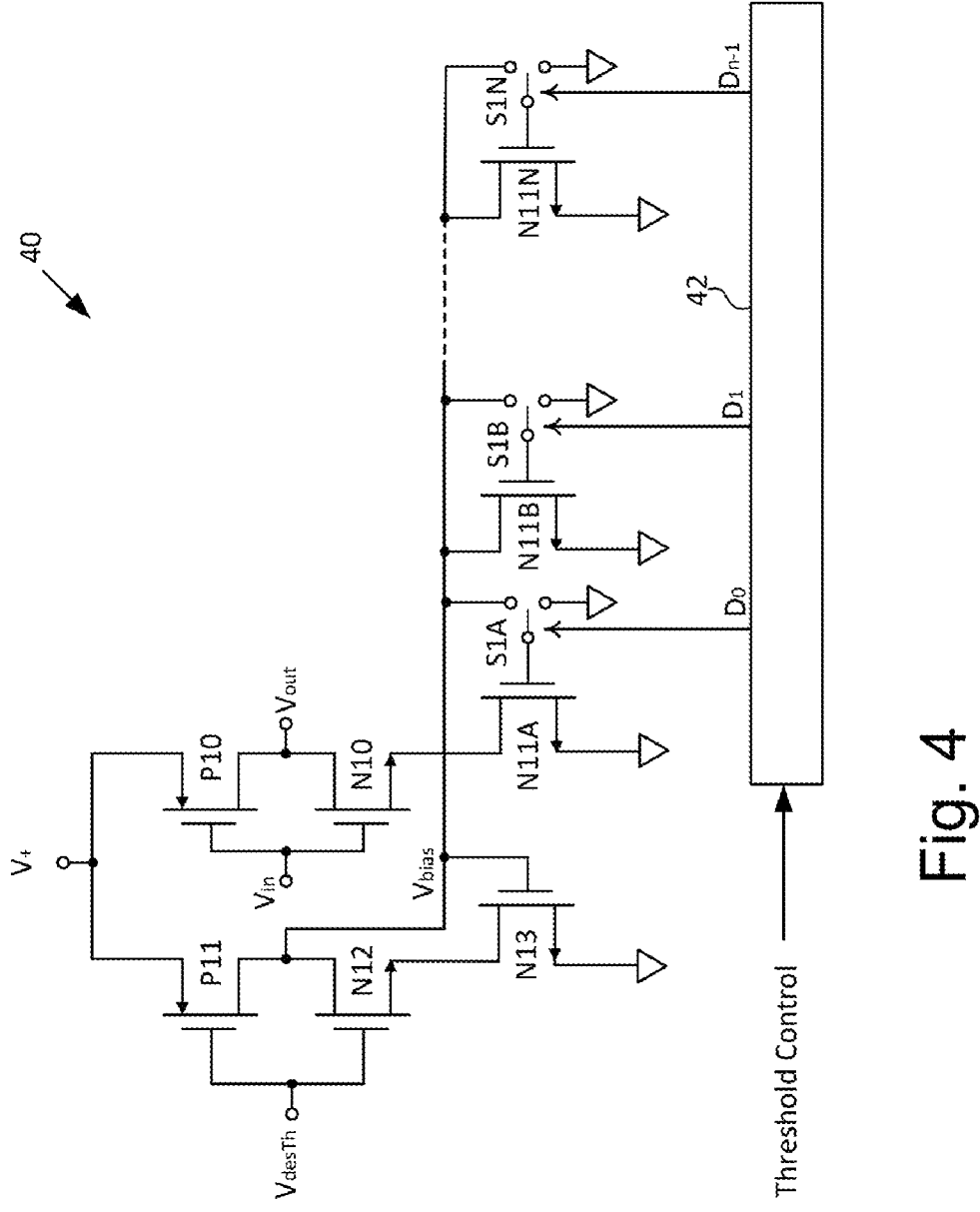
FIG. 4 is a schematic diagram of another example inverter 40 that may be used to implement inverters 22A and 22B in comparator 20 of FIG. 2A, in accordance with another embodiment of the disclosure.

Referring now to FIG. 4, a schematic diagram of another example inverter 40 that may be used to implement inverters 22A and 22B in comparator 20 of FIG. 2A is shown, in accordance with another embodiment of the disclosure. Example inverter 40 is similar to example inverter 30A of FIG. 3A, so only differences between them are described below. Example inverter 40 illustrates a digital version of an inverter 40 in accordance with an embodiment of the disclosure, in which the threshold control signal is a digital signal/signals that are provided to a control circuit 42 that operates a plurality of switches S1A-S1N to select combinations of, or individual ones of a plurality of degeneration transistors N11A-N11N that are coupled to the source terminal of transistor N10. Each of switches S1A-S1N applies either bias voltage $V_{bias}$ or ground, to the gate terminals of degeneration transistors N11A-N11N, according to control outputs $D_0$-$D_{n-1}$ generated by control circuit 42 according to a control value Threshold Control, so that the reference circuit formed by transistors P11, N12 and N13, tracks PVT variations for the circuit with a nominal selection of degeneration transistors N11A-N11N, but control value Threshold Control permits independent adjustment of the threshold voltage of the inverter formed by transistors P10 and N10.

Figures 5A, 5B:
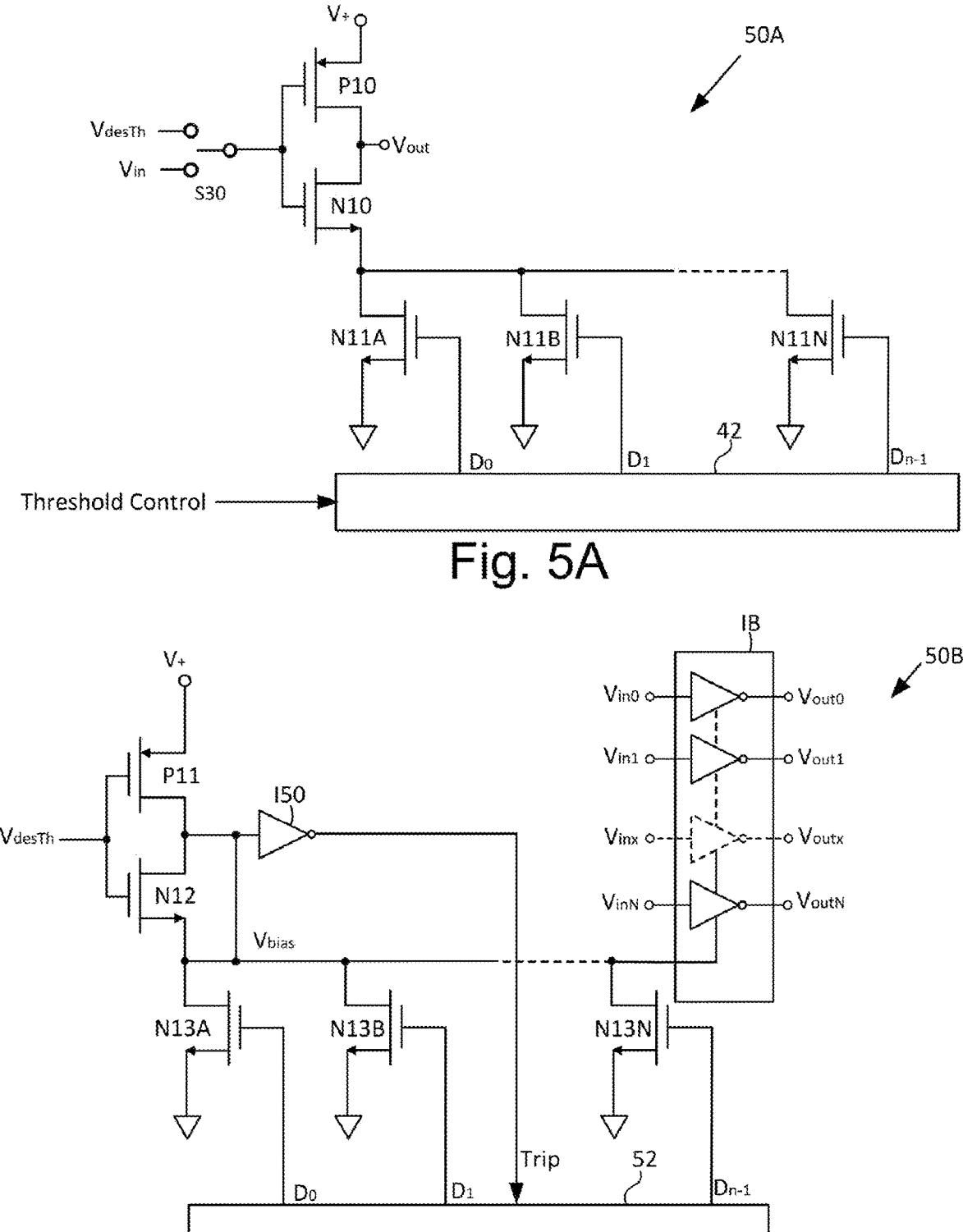
FIG. 5A and FIG. 5B are schematic diagrams of other example inverters 50A, 50B that may be used to implement inverters 22A and 22B in comparator 20 of FIG. 2A, in accordance with other embodiments of the disclosure.

Referring now to FIG. 5A and FIG. 5B, schematic diagrams of other example inverters 50A, 50B that may be used to implement inverters 22A and 22B in comparator 20 of FIG. 2 are shown, in accordance with other embodiments of the disclosure. Example inverters 50A, 50B are similar to example inverter 40 of FIG. 4, so only differences between them are described below. Example inverter 50A is another digital version of an inverter, in which the gate terminals of degeneration transistors N11A-N11N are controlled directly by outputs $D_0$-$D_{n-1}$ generated by control circuit 42, so that transistors N11A-N11N are either turned fully-on by application of a logical high-level signal or fully-off by a logical low-level signal to adjust the offset of the inverter stage formed by transistors P10, N10. FIG. 5B illustrates another example digital inverter circuit 50B in which a plurality of reference degeneration transistors N13A-N13N are either turned fully-on by application of logical high-level signals or fully-off by logical low-level signal values of outputs $D_0$-$D_{n-1}$ generated by a control circuit 52 to adjust the offset of the reference circuit push-pull stage formed by transistors P11, N12, thereby adjusting bias voltage $V_{bias}$. Bias voltage $V_{bias}$ may then be supplied to a plurality of inverter circuits in an inverter bank IB that generates outputs $V_{out0}$-$V_{outN}$ from corresponding inputs $V_{in0}$-$V_{inN}$, which may form part of, for example, a receiver having multiple parallel channels/bits. Alternatively, to improve threshold tracking over PVT of the individual inverters, outputs $D_0$-$D_{n-1}$ may be coupled to individual reference circuits associated with each inverter in inverter bank IB. The inverters of inverter bank IB are identical/scaled replicas of the reference circuit with a nominal selection of reference degeneration transistors N13A-N13N, as described above with reference to other examples, which illustrates the ability to duplicate the inverter portion of the circuit for as many inverters as are required for a particular application. Example inverter circuit 50B also illustrates a circuit and method of calibration of the inverter threshold voltage, by adjusting control values $D_0$-$D_{n-1}$ until a change occurs in the state of an input signal Trip provided to an input of control circuit 52 by an inverter 150 that evaluates bias voltage $V_{bias}$, indicating that bias voltage $V_{bias}$ has reached a voltage corresponding to desired threshold control voltage VdesTh. For example, control circuit 52 may be a counter that increments a number corresponding to control values $D_0$-$D_{n-1}$ and reference degeneration transistors N13A-N13N may have on-resistances that are binary-weighted, so that a change in control values $D_0$-$D_{n-1}$ represents a change in degeneration resistance and thus a corresponding change in threshold voltage. Alternatively, the weighting of reference degeneration transistors N13A-N13N may be equal, or according to a weighting other than binary, in order to provide a desired range of offset control.

Figure 6:
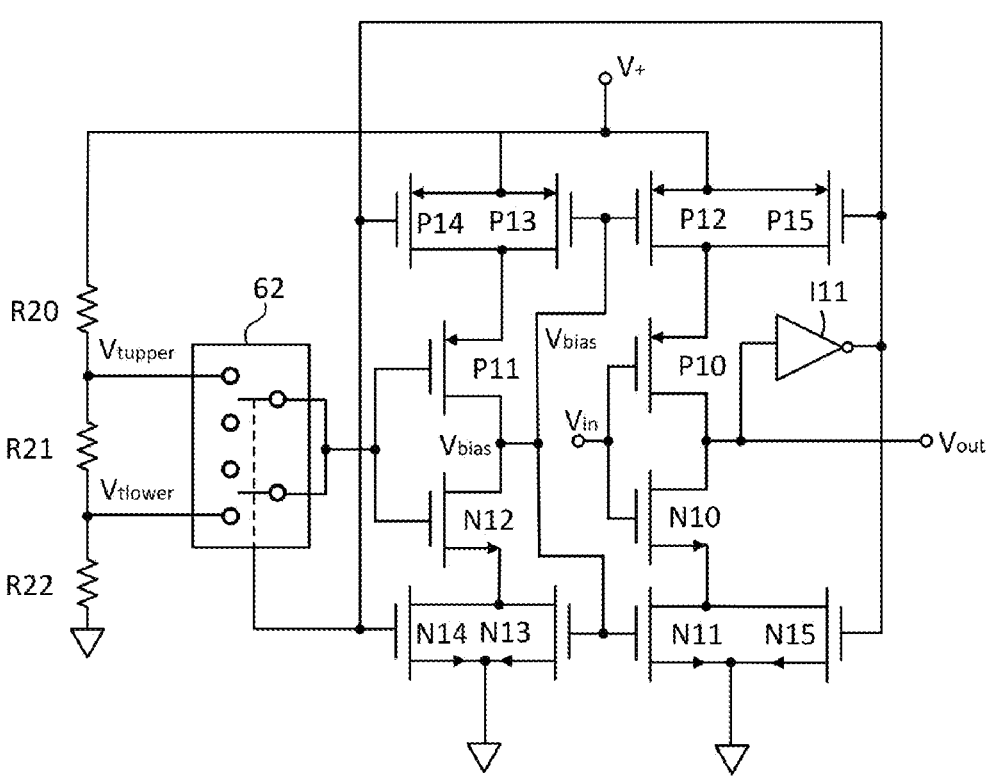
FIG. 6 is a schematic diagram of another example inverter 60 that may be used to implement inverters 22A and 22B in comparator 20 of FIG. 2A, in accordance with another embodiment of the disclosure.

Referring now to FIG. 6, a schematic diagram of another example inverter 60 that may be used to implement inverters 22A and 22B in comparator 20 of FIG. 2A is shown, in accordance with another embodiment of the disclosure. Example inverter 60 is similar to example inverter 30D of FIG. 3D, so only differences between them are described below. As in inverter 30D, inverter 60 employs a CMOS topology, with additional degeneration transistors P15 and N15 included to apply hysteresis to the push-pull inverter circuit formed by transistors N10, P10, N11, and P12 as controlled by output signal $V_{out}$ and an inverted version of output signal $V_{out}$ provided by an inverter I11. Additionally, a switching circuit 62 controls the threshold voltage applied to the input of the reference circuit formed by transistors P11, N12, P13 and N13 and additional degeneration transistors P14, N14 that are switched according to the state of the inverted version of output signal $V_{out}$ provided by inverter I11, which maintains the same degeneration resistance presence in the reference circuit as in the push-pull inverter circuit. A voltage divider formed by resistors R20-R22 generates two threshold control voltage levels $V_{upper}$ and $V_{lower}$, which are selected by switching circuit 62 according to the state of output signal $V_{out}$, which applies a hysteresis offset at the input of the reference circuit, i.e., to the gates of transistors P11, N12. Resistor R20 and R22 will generally be of equal value, so that the hysteresis is symmetrical about the midpoint of power supply voltage $V_+$.

Figure 7:
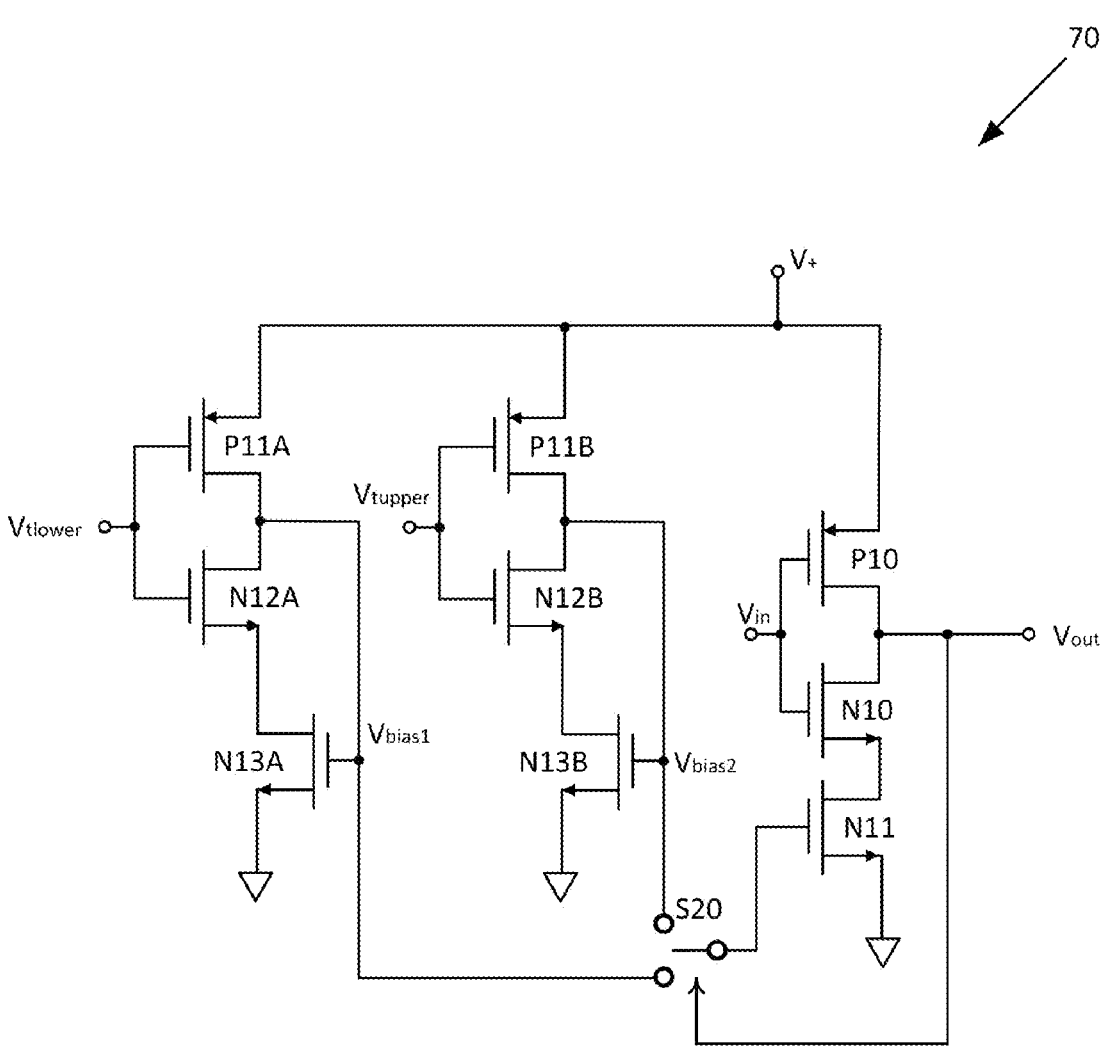
FIG. 7 is a schematic diagram of another example inverter 70 that may be used to implement inverters 22A and 22B in comparator 20 of FIG. 2A, in accordance with another embodiment of the disclosure.

Referring now to FIG. 7, a schematic diagram of another example inverter 70 that may be used to implement inverters 22A and 22B in comparator 20 of FIG. 2A is shown, in accordance with another embodiment of the disclosure. Example inverter 70 provides hysteresis, but is otherwise similar to example inverter 30A of FIG. 3A, so only differences between them are described below. Rather than adding or removing transistors to change the degeneration resistance in parallel with transistor N11, or in parallel with transistor N13A to change the reference degeneration resistance, in example inverter 70 two separate reference circuits, one implemented by transistors P11A, N12A and N13A, and another implemented by transistors P11B, N12B and N13B, generate two bias voltages: $V_{bias1}$ and $V_{bias2}$, respectively. A switch S20 selects between applying bias voltage $V_{bias1}$ or bias voltage $V_{bias2}$ to the gate of transistor N11, according to the state of output signal $V_{out}$, setting hysteresis thresholds directly according to control voltages $V_{tlower}$ and $V_{tupper}$, which are provided as inputs to the two corresponding reference circuits.

Figure 8:
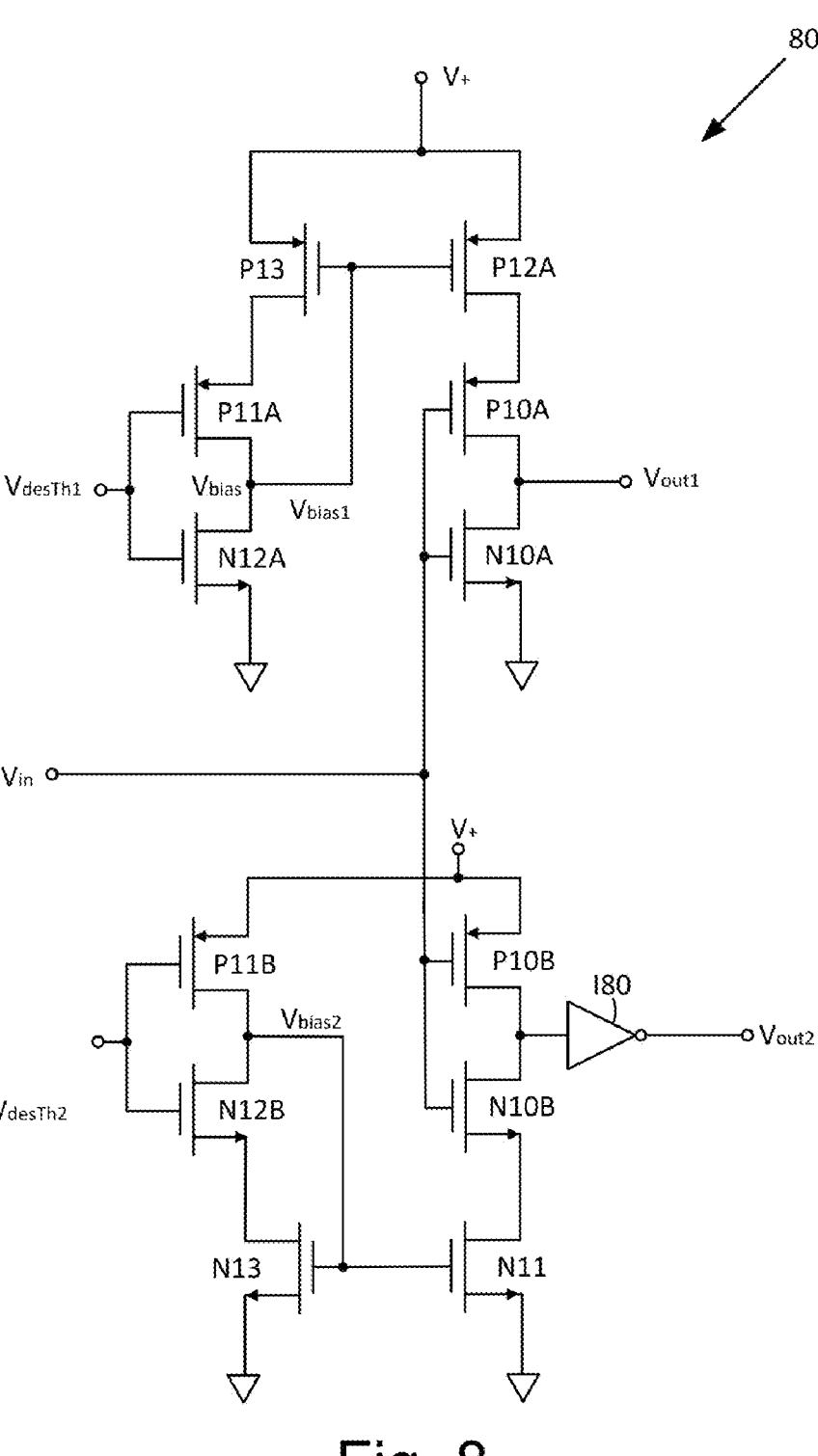
FIG. 8 is a schematic diagram of an example non-overlapping set-reset circuit 80 that may be used to implement both of inverters 22A and 22B in comparator 20 of FIG. 2A, in accordance with an embodiment of the disclosure.

Referring now to FIG. 8, a schematic diagram of an example non-overlapping set-reset circuit 80 that may be used to implement both of inverters 22A and 22B in comparator 20 of FIG. 2A is shown, in accordance with an embodiment of the disclosure. A first inverter circuit, which may be identical in construction to PMOS-topology inverter circuit 30C of FIG. 3C, is formed by transistors P10A, N10A, P11A, N12A, P12A and P13, receives a first control threshold voltage $V_{desTh1}$ at an input of the reference circuit, i.e., the gates of transistors P11A, N12A, and has an internal bias voltage $V_{bias1}$. A second inverter circuit of NMOS topology, which may be identical in construction to inverter circuit 30A of FIG. 3A, is formed by transistors P10B, N10B, N11, P11B, N12B, and N13, receives a second threshold control voltage $V_{desTh2}$ at an input of the reference circuit, i.e., the gates of transistors P11B, N12B, and has an internal bias voltage $V_{bias2}$. The output of the second inverter provided at the drain terminals of transistors P10B, N10B is inverted by an inverter 180. The resulting operation of set-reset circuit 80, generates a set output $V_{OUT1}$ when input signal $V_{in}$ exceeds first threshold control voltage $V_{desTh1}$ and a reset signal at output $V_{OUT2}$ falls below second threshold control voltage $V_{desTh2}$. The resulting circuit may be used directly to implement inverters 22A and 22B of FIG. 2A, as mentioned above, and which provide respective set and reset inputs to the gates of transistors N3 and N4 in comparator 20 of FIG. 2 to set and reset the cross-coupled latch.

In summary, this disclosure shows and describes circuits and integrated circuits implementing an inverter stage that may be used in a Schmitt trigger/hysteresis comparator or an analog-to-digital converter. The circuit may include an inverter stage having a first complementary pair of transistors connected in a push-pull configuration, and an input of the inverter stage may be coupled to the gates of the first complementary pair of transistors. An output of the inverter may be coupled to the drains of the first complementary pair of transistors, and the circuit may also include one or more first degeneration transistors coupled between a source of one of the first complementary pair of transistors and a power supply rail of the circuit. The circuit may also include a reference circuit having an output coupled to one or more gates of the one or more first degeneration transistors, and that may control the one or more first degeneration transistors to cause the inverter stage to have a threshold voltage equal to a threshold control voltage.

In some example embodiments, the reference circuit may include a second complementary pair of transistors connected in a push-pull configuration, and an input of reference circuit may be coupled to the gates of the second complementary pair of transistors and receives the threshold control voltage. The output of the reference circuit may be provided from a connection coupled to the drains of the second complementary pair of transistors, and the circuit may also include a reference degeneration transistor coupled between a source of one of the second complementary pair of transistors and the power supply rail of the circuit. A gate of the reference degeneration transistor and a gate of the first degeneration transistor may be coupled to the output of the reference circuit and receive a bias voltage therefrom, so that the threshold control voltage adjusts the threshold of the inverter.

In some example embodiments, the output of the reference circuit may be selectably coupled to the one or more gates of the one or more first degeneration transistors, so that the adjustment of the threshold of the inverter is disabled when coupling of the output of the reference circuit to the gate of the first degeneration transistor is deselected. In some example embodiments, the reference degeneration transistor may be coupled between a negative power supply rail and a source of an N-channel device of the first complementary pair of transistors, and the circuit may also include one or more second degeneration transistors coupled between a source of a P-channel device of the first complementary pair of transistors and a positive power supply rail of the circuit. The gate of the reference degeneration transistor may be coupled to the gate of the third degeneration transistor.

In some example embodiments, the reference degeneration transistor may be coupled between a negative power supply rail and a source of an N-channel device of the first complementary pair of transistors, the reference circuit may be a first reference circuit, the bias voltage may be first bias voltage, and the threshold control voltage may be a first threshold control voltage. The circuit may further include a third degeneration transistor coupled between a source of a P-channel device of the first complementary pair of transistors and a positive power supply rail of the circuit, and a second reference circuit for providing a second bias voltage to a gate of the third degeneration transistor. The second reference circuit may include a third complementary pair of transistors connected in a push-pull configuration, and an input of the second reference circuit may be coupled to the gates of the third complementary pair of transistors and receive a second threshold control voltage. An output of the second reference circuit may be provided from a connection coupled to the drains of the third complementary pair of transistors.

In some example embodiments, the inverter stage may be a first inverter stage, the input of the first inverter stage may be an input to Schmitt comparator, and the reference degeneration transistor may be coupled between a negative power supply rail and a source of an N-channel device of the first complementary pair of transistors. The reference circuit may be a first reference circuit, the bias voltage may be a first bias voltage, and the threshold control voltage may be a lower switching threshold. The circuit may further include a second inverter stage including a third complementary pair of transistors connected in a push-pull configuration, and an input of the second inverter stage may be coupled to the gates of the third complementary pair of transistors and to the input of the first inverter stage. An output of the second inverter stage may be coupled to the drains of the third complementary pair of transistors, and the circuit may include a third degeneration transistor coupled between a source of one of the third complementary pair of transistors and a positive power supply rail of the circuit, a second reference circuit for providing a second bias voltage to a gate of the third degeneration transistor. The second reference circuit may include a fourth complementary pair of transistors connected in a push-pull configuration. An input of the second reference circuit may be coupled to the gates of the fourth complementary pair of transistors and receive an upper threshold control voltage, and an output of the second reference circuit may be provided from a connection coupled to the drains of the fourth complementary pair of transistors. The circuit may also include a cross-coupled latch having a set input coupled to an output of the first inverter stage and a reset input coupled to an output of the second inverter stage, so that the output of the cross-coupled latch provides an output of the Schmitt comparator.

In some example embodiments, the circuit may further include a bypass circuit coupled between a source and a drain of the one or more degeneration transistors that may be enabled according to a state of the output of the first inverter stage to bypass the one or more degeneration transistors, so that the bypass circuit adds hysteresis to a switching characteristic of the inverter. In some example embodiments, the inverter may be decision stage of one-bit ADC. In some example embodiments, the reference circuit may further include switching circuit that selects one of a plurality of bias voltages to supply the threshold control voltage to the reference circuit. In some example embodiments, the switching circuit may have a control input coupled to an output of the inverter.

In some example embodiments, the one or more first degeneration transistors may include multiple degeneration transistors, and the circuit may further include a switching circuit that selectively couples the one or more first degeneration transistors between the source of one of the second complementary pair of transistors and the power supply rail of the circuit according to a digital control value. In some example embodiments, the one or more first degeneration transistors may include multiple degeneration transistor, and the circuit may also include a switching circuit that selectively couples gates of the one or more first degeneration transistors to the bias voltage or the power supply rail of the circuit according to a digital control value.

In some example embodiments, the reference circuit may further include a switching circuit coupled to gates of the one or more first degeneration transistors to individually activate the one or more first degeneration transistors according to a digital control value, and the switching circuit may be coupled to the input of the inverter stage to selectively apply the threshold control voltage to the input of the inverter stage. The circuit may also include a control circuit that operates the switching circuit successively by adjusting the digital control value to activate the one or more first degeneration transistors while the threshold control voltage is applied to the input of the inverter until the output of the inverter stage changes state at a terminal value of the digital control value. The control circuit may maintain the digital control value at the terminal value during subsequent operation of the inverter.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to other types of circuits that include inverter or comparator topologies.

What is claimed is:

1. A circuit, comprising:

an inverter stage including a first complementary pair of transistors connected in a push-pull configuration, wherein an input of the inverter stage is coupled to gates of the first complementary pair of transistors and an output of the inverter stage is coupled to drains of the first complementary pair of transistors;

one or more first degeneration transistors coupled between a source of one of the first complementary pair of transistors and a power supply rail of the circuit;

a reference circuit having an output coupled to one or more gates of the one or more first degeneration transistors and that controls the one or more first degeneration transistors to cause the inverter stage to have a threshold voltage equal to a threshold control voltage, wherein the reference circuit comprises a second complementary pair of transistors connected in a push-pull configuration, wherein an input of the reference circuit is coupled to gates of the second complementary pair of transistors and receives the threshold control voltage, and wherein the output of the reference circuit is provided from a connection coupled to drains of the second complementary pair of transistors; and a reference degeneration transistor coupled between a source of one of the second complementary pair of transistors and the power supply rail of the circuit, and wherein a gate of the reference degeneration transistor and the one or more gates of the one or more first degeneration transistors are coupled to the output of the reference circuit and receive a bias voltage therefrom, whereby the threshold control voltage adjusts the threshold of the inverter stage.

2. The circuit of claim 1, wherein the output of the reference circuit is selectably coupled to the one or more gates of the one or more first degeneration transistors, whereby the adjustment of the threshold of the inverter stage is disabled when coupling of the output of the reference circuit to the one or more gates of the one or more first degeneration transistors is deselected.

3. The circuit of claim 1, wherein the power supply rail is a negative power supply rail, wherein the reference degeneration transistor is coupled between the negative power supply rail and a source of an N-channel device of the first complementary pair of transistors, and wherein the circuit further comprises one or more second degeneration transistors coupled between a source of a P-channel device of the first complementary pair of transistors and a positive power supply rail of the circuit, and wherein the gate of the reference degeneration transistor is coupled to a gate of the one or more second degeneration transistors.

4. The circuit of claim 1, wherein the inverter stage is a first inverter stage, wherein the input of the first inverter stage is an input to Schmitt comparator, wherein the power supply rail is a negative power supply rail, wherein the reference degeneration transistor is coupled between the negative power supply rail and a source of an N-channel device of the first complementary pair of transistors, wherein the reference circuit is a first reference circuit, wherein the bias voltage is a first bias voltage, wherein the threshold control voltage is a lower threshold control voltage, and wherein the circuit further comprises:

a second inverter stage including a third complementary pair of transistors connected in a push-pull configuration, wherein an input of the second inverter stage is coupled to gates of the third complementary pair of transistors and to the input of the first inverter stage, and wherein an output of the second inverter stage is coupled to drains of the third complementary pair of transistors;

a second degeneration transistor coupled between a source of one of the third complementary pair of transistors and a positive power supply rail of the circuit;

a second reference circuit for providing a second bias voltage to a gate of the second degeneration transistor, wherein the second reference circuit comprises a fourth complementary pair of transistors connected in a push-pull configuration, wherein an input of the second reference circuit is coupled to gates of the fourth complementary pair of transistors and receives an upper threshold control voltage, and wherein an output of the second reference circuit is provided from a connection coupled to drains of the fourth complementary pair of transistors; and a cross-coupled latch having a set input coupled to the output of the first inverter stage and a reset input coupled to the output of the second inverter stage, whereby an output of the cross-coupled latch provides an output of the Schmitt comparator.

5. The circuit of claim 1, further comprising a bypass circuit coupled between a source and a drain of the one or more first degeneration transistors and that is enabled according to a state of the output of the inverter stage to bypass the one or more degeneration transistors, whereby the bypass circuit adds hysteresis to a switching characteristic of the inverter stage.

6. The circuit of claim 1, wherein the inverter stage is a decision stage of a one-bit analog-to-digital converter.

7. The circuit of claim 1, wherein the reference circuit further comprises a switching circuit that selects one of a plurality of bias voltages to supply the threshold control voltage to the reference circuit.

8. The circuit of claim 7, wherein the switching circuit has a control input coupled to the output of the inverter stage.

9. The circuit of claim 1, wherein the one or more first degeneration transistors comprises multiple degeneration transistors, and wherein the circuit further comprises a switching circuit that selectively couples the one or more first degeneration transistors between the drain of one of the second complementary pair of transistors and the power supply rail of the circuit according to a digital control value.

10. The circuit of claim 1, wherein the one or more first degeneration transistors comprises multiple degeneration transistors, and wherein the circuit further comprises a switching circuit that selectively couples the one or more gates of the one or more first degeneration transistors to the bias voltage or the power supply rail of the circuit according to a digital control value.

11. A method of inverting an input signal, comprising:

receiving an input signal at an input of an inverter stage, the inverter stage including a first complementary pair of transistors connected in a push-pull configuration, wherein the input of the inverter stage is coupled to gates of the first complementary pair of transistors and an output of the inverter stage is coupled to drains of the first complementary pair of transistors;

controlling a threshold voltage of the inverter stage with one or more first degeneration transistors coupled between a source of one of the first complementary pair of transistors and a power supply rail and a reference circuit having an output coupled to one or more gates of the one or more first degeneration transistors, wherein the reference circuit controls the one or more first degeneration transistors to cause the inverter stage to have a threshold voltage equal to a threshold control voltage;

receiving the threshold control voltage at an input of the reference circuit, wherein the reference circuit comprises a second complementary pair of transistors connected in a push-pull configuration, and wherein the threshold control voltage is provided to gates of the second complementary pair of transistors;

providing the output of the reference circuit from a connection coupled to drains of the second complementary pair of transistors;

biasing the reference circuit with a bias voltage applied to a gate of a reference degeneration transistor coupled between a source of one of the second complementary pair of transistors and the power supply rail; and biasing the inverter stage with the bias voltage by applying the bias voltage to the one or more corresponding gates of the one or more first degeneration transistors.

12. The method of claim 11, further comprising:

selectably coupling the output of the reference circuit to the one or more gates of the one or more first degeneration transistors to adjust the threshold of the inverter stage; and disabling the adjustment of the threshold of the inverter stage by decoupling the output of the reference circuit the one or more gates of the one or more first degeneration transistors.

13. The method of claim 11, wherein the power supply rail is a negative power supply rail, wherein the reference degeneration transistor is coupled between the negative power supply rail and a source of an N-channel device of the first complementary pair of transistors, and wherein the method further comprises biasing one or more second degeneration transistors coupled between a source of a P-channel device of the first complementary pair of transistors and a positive power supply rail to adjust the threshold voltage of the inverter stage.

14. The method of claim 11, wherein inverter stage is a first inverter stage, wherein the input of the first inverter stage is an input to Schmitt comparator, wherein the power supply rail is a negative power supply rail, wherein the reference degeneration transistor is coupled between the negative power supply rail and a source of an N-channel device of the first complementary pair of transistors, wherein the reference circuit is a first reference circuit, wherein the bias voltage is a first bias voltage, wherein the threshold control voltage is a lower threshold control voltage, and wherein the method further comprises:

receiving the input signal at an input of a second inverter stage, the second inverter stage including a third complementary pair of transistors connected in a push-pull configuration, wherein the input of the second inverter stage is coupled to gates of the third complementary pair of transistors and an output of the second inverter stage is coupled to drains of the third complementary pair of transistors;

controlling a threshold voltage of the second inverter stage with one or more third degeneration transistors coupled between a source of one of the third complementary pair of transistors and a positive power supply rail and a second reference circuit having an output coupled to one or more gates of the one or more third degeneration transistors, wherein the second reference circuit controls the one or more third degeneration transistors to cause the second inverter stage to have a threshold voltage equal to an upper threshold control voltage; and capturing state changes of the first inverter stage and the second inverter stage with a cross-coupled latch having a set input coupled to the output of the first inverter stage and a reset input coupled to the output of the second inverter stage, whereby an output of the cross-coupled latch provides an output of a Schmitt comparator.

15. The method of claim 11, further comprising bypassing the one or more first degeneration transistors with a bypass circuit coupled between a source and a drain of the one or more first degeneration transistors, according to a state of the output of the inverter stage to bypass the one or more first degeneration transistors, whereby the bypass circuit adds hysteresis to a switching characteristic of the inverter stage.

16. The method of claim 11, wherein the inverter stage is a decision stage of a one-bit ADC.

17. The method of claim 11, further comprising selecting one of a plurality of bias voltages with a switching circuit threshold control voltage to the reference circuit.

18. The method of claim 17, further comprising receiving a control input to the switching circuit from the output of the inverter stage.

19. The method of claim 11, wherein the one or more first degeneration transistors comprises multiple degeneration transistors, and wherein the method further comprises selectively coupling the one or more first degeneration transistors between the drain of one of the second complementary pair of transistors and the power supply rail of the circuit according to a digital control value.

20. The method of claim 11, wherein the one or more first degeneration transistors comprises multiple degeneration transistors, and wherein the method further comprises selectively coupling the one or more gates of the one or more first degeneration transistors to the bias voltage or the power supply rail according to a digital control value.

* * * * *